United States Patent [19]
Kubota et al.

[11] Patent Number: 5,625,935
[45] Date of Patent: May 6, 1997

[54] METHOD OF MANUFACTURING A MULTILAYER ELECTRONIC COMPONENT

[75] Inventors: Kenji Kubota; Norio Sakai; Shoichi Kawabata, all of Kyoto, Japan

[73] Assignee: Murata Manufacturing Co., Ltd., Japan

[21] Appl. No.: 227,022

[22] Filed: Apr. 13, 1994

Related U.S. Application Data

[62] Division of Ser. No. 96,719, Jul. 23, 1993, abandoned.

[30] Foreign Application Priority Data

Jul. 27, 1992 [JP] Japan ................................. 4-199795

[51] Int. Cl.$^6$ ................................................. H01R 43/00
[52] U.S. Cl. ........................ 29/25.42; 29/854; 29/602.1
[58] Field of Search ........................... 29/25.35, 25.42, 29/854–856, 852, 853, 573, 602.1

[56] References Cited

U.S. PATENT DOCUMENTS

| | | | |
|---|---|---|---|
| 4,821,007 | 4/1989 | Fields et al. | 29/830 X |
| 5,140,745 | 8/1992 | McKenzie, Jr. | 29/852 |
| 5,488,765 | 2/1996 | Kubota et al. | 29/593 |

Primary Examiner—Carl E. Hall
Attorney, Agent, or Firm—Ostrolenk, Faber, Gerb & Soffen, LLP

[57] ABSTRACT

In order to provide a multilayer electronic component which can reduce arrangement pitches for external electrodes, via holes filled up with conductive materials are provided in a mother laminate, which is obtained by stacking a plurality of insulating sheets with interposition of conductor films, in positions parted by cutting. The conductive materials define external electrodes of individual multilayer electronic components which are obtained by cutting the mother laminate. No specific step is required for forming the external electrodes, and characteristics of each multilayer electronic component can be efficiently measured in the state of the mother laminate.

7 Claims, 9 Drawing Sheets

F I G. 1
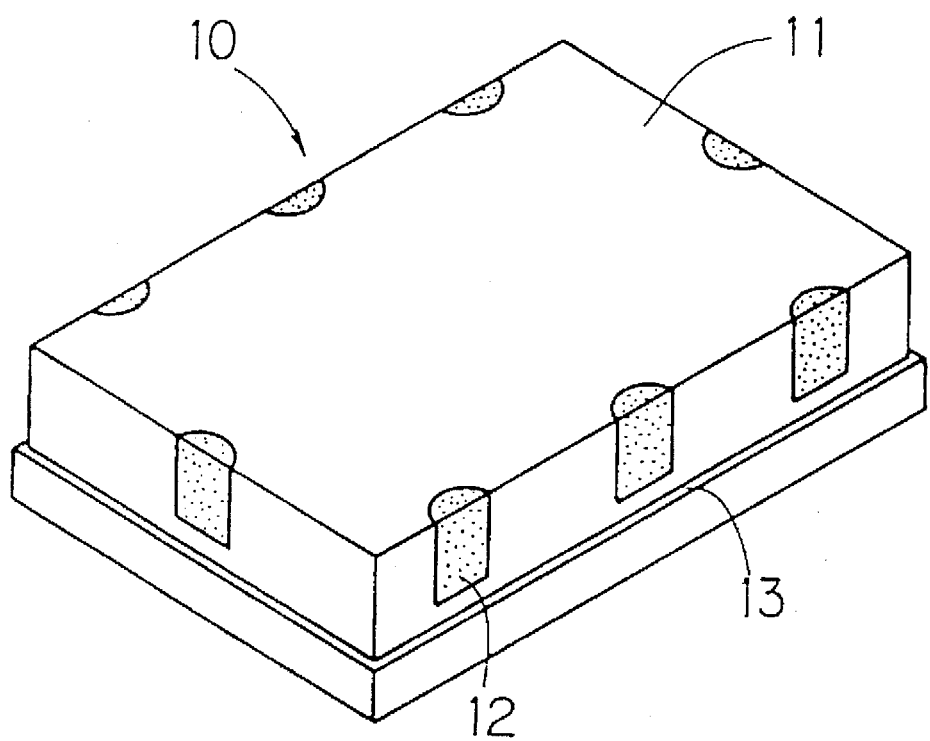

METHOD OF MANUFACTURING A MULTILAYER ELECTRONIC COMPONENT

This is a division of application Ser. No. 08/096,719, filed Jul. 23, 1993 abandoned.

BACKGROUND OF THE INVENTION

1. Field of the Invention

The present invention relates to a multilayer electronic component having internal circuit elements arranged therein, a method of manufacturing the same and a method of measuring characteristics thereof, and more particularly, it relates to an improvement in a mode of forming external electrodes in a multilayer electronic component.

2. Description of the Background Art

A multilayer electronic component, which is represented by a multilayer capacitor, a multilayer inductor, a multilayer circuit board or a multilayer composite electronic component, for example, comprises a laminate which is obtained by stacking a plurality of insulating sheets with interposition of internal circuit elements such as conductor films and/or resistor films. The insulating sheets are typically prepared from ceramic sheets.

FIG. 15 is a perspective view showing the appearance of a conventional multilayer electronic component 1. The multilayer electronic component 1 comprises a laminate 2 which is obtained by stacking a plurality of insulating sheets with interposition of internal circuit elements (not shown). The laminate 2 is provided on its four side surfaces, for example, with external electrodes 3 respectively. These external electrodes 3 are electrically connected with the internal circuit elements which are located in the interior of the laminate 2. The external electrodes 3 are formed by applying proper metal paste to specific positions of the respective side surfaces of the laminate 2, and parts of the external electrodes 3 necessarily extend circumferentially on upper and lower surfaces of the laminate 2 at this time.

FIG. 16 is a perspective view showing the appearance of another type of conventional multilayer electronic component 4. This multilayer electronic component 4 also comprises a laminate 5 which is obtained by stacking a plurality of insulating sheets with interposition of internal circuit elements (not shown). The laminate 5 is provided on its four side surfaces, for example, with external electrodes 6 which are electrically connected with the internal circuit elements. These external electrodes 6 are provided by dividing through holes 7, as shown by phantom lines in FIG. 16. Namely, a mother laminate is so prepared that a plurality of multilayer electronic components 4 can be obtained when the same is cut along prescribed cutting lines. The through holes 7 are formed in this mother laminate so that conductor films are formed on inner peripheral surfaces thereof for defining the external electrodes 6, and the mother laminate is thereafter cut to divide the through holes 7. Also in such a multilayer electronic component 4, parts of the external electrodes 6 extend circumferentially on upper and lower surfaces of the laminate 5, due to the method of forming the conductor films for defining the external electrodes 6.

These multilayer electronic components 1 and 4 are surface-mounted on proper circuit boards through the external electrodes 3 and 6, in the form of chips.

In both of the aforementioned multilayer electronic components 1 and 4, however, the external electrodes 3 and 6 are formed to extend toward the upper and lower surfaces of the laminates 2 and 5. When other components are mounted on the upper and/or lower surface(s) of such multilayer electronic components 1 and 4 to be composited with the same, therefore, areas capable of mounting such components are restricted.

Further, the parts of the external electrodes 3 and 6 extending toward the upper and lower surfaces of the laminates 2 and 5 inhibit reduction of arrangement pitches for the external electrodes 3 and 6. In addition, it is relatively difficult to form such parts of the external electrodes 3 and 5 in constant sizes and shapes, and this also inhibits reduction of the arrangement pitches for the external electrodes 3 and 6.

Particularly in the multilayer electronic component 4 shown in FIG. 16, it is difficult to reduce the diameters of the through holes 7, which are formed by a drill, below 0.3 mm, and this also restricts the arrangement pitches for the external electrodes 6. Further, the drill for forming the through holes 7 has a relatively short life, leading to increase in cost.

In the multilayer electronic component 1 shown in FIG. 15, on the other hand, the external electrodes 3 are formed on the four side surfaces of the laminate 2 respectively and hence it is necessary to carry out at least application of the metal paste onto the respective side surfaces independently of each other. As the result, the number of steps for forming the external electrodes 3 is increased.

On the other hand, it is necessary to measure characteristics of the multilayer electronic components 1 and 4 at least in advance of shipping. In both of the multilayer electronic components 1 and 4, however, the characteristics cannot be measured unless the same are brought into states of chips in principle. In the multilayer electronic component 1 shown in FIG. 15, measurement of the characteristics is enabled after formation of the external electrodes 3. Also in the case shown in FIG. 16, the characteristics of each multilayer electronic component 4 cannot be measured in the stage of the mother laminate. Such measurement of the characteristics is enabled only when the mother laminate is cut to divide the through holes 7.

SUMMARY OF THE INVENTION

Accordingly, an object of the present invention is to provide a multilayer electronic component which can reduce arrangement pitches for external electrodes, and a method of manufacturing the same.

Another object of the present invention is to provide a characteristic measuring method which can efficiently measure characteristics of a plurality of multilayer electronic components.

A multilayer electronic component according to the present invention comprises a laminate which is obtained by stacking a plurality of insulating sheets with interposition of internal circuit elements, and external electrodes which are formed on outer surfaces of the laminate to be electrically connected with the internal circuit elements. The external electrodes are formed by exposing at least side portions of via holes, which are provided in the insulating sheets and coated with conductive materials, by cutting the insulating sheets.

A method of manufacturing a multilayer electronic component according to the present invention comprises a step of preparing a mother laminate, which is to be cut along prescribed cutting lines for obtaining a plurality of multilayer electronic components, being obtained by stacking a plurality of mother insulating sheets with interposition of internal circuit elements for the respective multilayer electronic components to distribute the internal circuit elements in regions parted by the cutting lines and having via holes, coated with conductive materials being electrically connected with the internal circuit elements, provided in positions to be exposed on cut surfaces by cutting along the cutting lines, and a step of cutting the mother laminate along the cutting lines.

A method of measuring characteristics of a multilayer electronic component according to the present invention comprises a step of preparing a mother laminate, which is to be cut along prescribed cutting lines for obtaining a plurality of multilayer electronic components, obtained by stacking a plurality of mother insulating sheets with interposition of internal circuit elements for the respective multilayer electronic components to distribute the internal circuit elements in regions parted by the cutting lines and provided with via holes, coated with conductive materials being electrically connected with the internal circuit elements, in positions to be exposed on cut surfaces by cutting along the cutting lines, a step of forming grooves in the mother laminate along the cutting lines thereby exposing at least the via holes on inner side surfaces of the grooves, and a step of measuring characteristics of each multilayer electronic component while treating the via holes being exposed on the inner side surfaces of the grooves as external electrodes.

The configuration of the multilayer electronic components provided in the aforementioned characteristic measuring method, i.e., an assembly of the multilayer electronic components consisting of the mother laminate provided with the grooves, can be shipped in this state.

According to the inventive multilayer electronic component, the external electrodes are provided by exposing at least side portions of the via hole which are coated with conductive materials. In this case, the via holes can be readily formed in small diameters by punching with no employment of a drill, whereby arrangement pitches for the external electrodes can be reduced. Further, it is possible to avoid increase in cost resulting from a short life of a drill since it is not necessary to employ such a drill.

The external electrodes provided by the via holes require no mode of formation of extending circumferentially on at least one major surface of the laminate, whereby at least one major surface of the laminate can be widely employed as a surface for mounting another component to be composited with the same. Thus, it is possible to improve density in component mounting.

Since the external electrodes are provided by the conductive materials which are applied to the via holes, it is possible to attain relatively large dimensions corresponding to film thicknesses of the external electrodes by filling up the via holes with the conductive materials. Thus, it is possible to reduce a problem of solder leaching when the multilayer electronic component is soldered to a circuit board. Since the conductive materials for defining the external electrodes are embedded in parts of the via holes, it is possible to improve strength of soldering.

According to the inventive method of manufacturing a multilayer electronic component, the via holes coated with the conductive materials for providing the external electrodes are already formed in the mother laminate so that the conductive materials are exposed to define the external electrodes by cutting the mother laminate, whereby no specific step is required for providing the external electrodes.

According to the inventive method of measuring characteristics of a multilayer electronic component, further, it is possible to independently measure characteristics of a plurality of multilayer electronic components, which are mechanically integrated with each other in the form of a mother laminate in a state being electrically independent of each other, due to formation of the grooves. Therefore, it is not necessary to handle mechanically independent multilayer electronic components, but characteristics of a number of multilayer electronic components can be efficiently measured by screening, for example.

When the assembly of the multilayer electronic components consisting of a mother laminate provided with the grooves, which is a configuration to be subjected to the aforementioned measurement of characteristics, is shipped in this state, the user can take out the respective multilayer electronic components from the mother laminate by simply dividing the same along the grooves. It is to be noted that each multilayer electronic component can be subjected to mounting with no problem in this case since the same can be through with measurement of its characteristics, and the assembly of such multilayer electronic components is easy to pack and handle as compared with multilayer electronic components which are separated from each other.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view showing the appearance of a multilayer electronic component 10 according to an embodiment of the present invention;

DESCRIPTION OF THE PREFERRED EMBODIMENTS

FIG. 1 is a perspective view showing the appearance of a multilayer electronic component 10 according to an embodiment of the present invention. While the multilayer electronic component 10 is mounted on a proper circuit board in the chip-type configuration as illustrated, FIG. 1 shows the multilayer electronic component 10 in a state upwardly directing its surface which is faced toward such a circuit board.

The multilayer electronic component 10 comprises a laminate 11, which is formed by stacking a plurality of insulating sheets with interposition of internal circuit elements (not shown). The laminate 11 is provided on respective ones of its four side surfaces, for example, with external electrodes 12 which are exposed on outer surfaces of the laminate 11. These external electrodes 12 are electrically connected with the internal circuit elements (not shown).

The aforementioned external electrodes 12 are formed by exposing at least side portions of via holes, which are provided in the insulating sheets and filled up with conductive materials, by cutting the insulating sheets, as clearly understood from the following description of a manufacturing method. The laminate 11 is provided on respective ones of its four side surfaces, for example, with steps 13, while the reason why such steps 13 are formed is also clarified by the following description of the manufacturing method.

Figure 2:
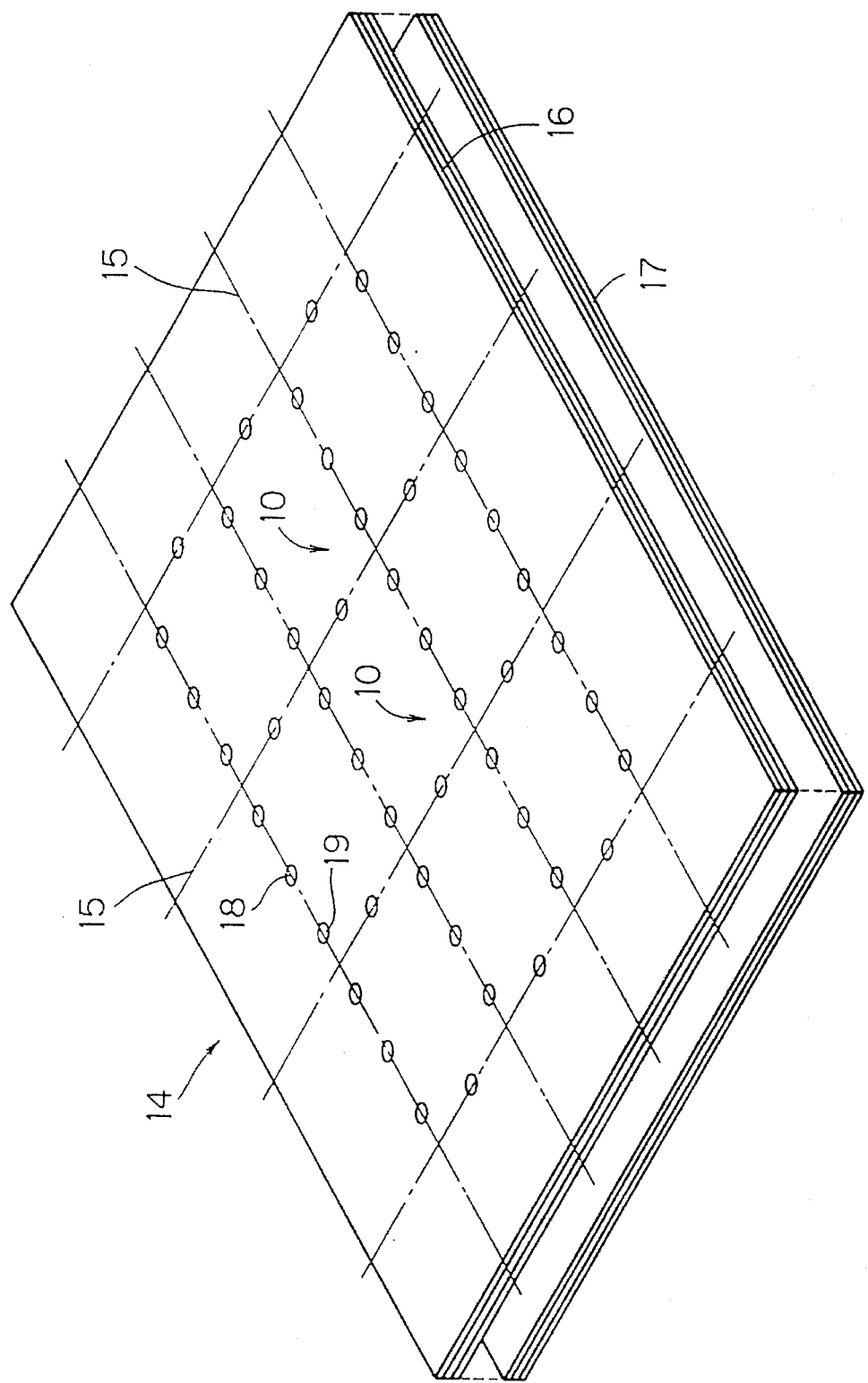
FIG. 2 is a perspective view showing a mother laminate 14 which is prepared for obtaining the multilayer electronic component 10 shown in FIG. 1.

In order to obtain the aforementioned multilayer electronic component 10, a mother laminate 14 is prepared as shown in FIG. 2. The mother laminate 14, which is to be cut along prescribed cutting lines 15 shown by one-dot chain lines to provide a plurality of multilayer electronic components 10, is obtained by stacking a plurality of mother insulating sheets 16 and a plurality of mother insulating sheets 17 with interposition of internal circuit elements (not shown) for the respective multilayer electronic components 10 to distribute the internal circuit elements in respective regions parted through the cutting lines 15. This mother laminate 14 is provided with via holes 19 filled up with conductive materials 18 which are electrically connected with the internal circuit elements (not shown) in positions to be partitioned by cutting along the cutting lines 15. The external electrodes 12 shown in FIG. 1 are provided by the conductive materials 18 which are filled up in the via holes 19.

In order to obtain the aforementioned mother laminate 14, the following steps are carried out, for example. According to this embodiment, the mother insulating sheets 16 and 17 are formed by ceramic sheets.

First, sheet forming is carried out by a doctor blade coater or the like, to obtain ceramic green sheets for defining the mother insulating sheets 16 and 17. Specific ones of these ceramic green sheets are provided with via holes by punching or the like, in order to enable electrical conduction through the sheets along the direction of thickness. At this time, the ceramic green sheets for defining the mother insulating sheets 16, which are located on relatively upper portions in FIG. 2, are further provided with via holes 19. Then, conductor films and/or resistor films for serving as internal circuit elements are printed on specific ones of the ceramic green sheets. At this time, the already formed via holes are filled up with conductive materials, while the via holes 19 shown in FIG. 2 are filled up with conductive materials 18. When the conductor films are printed from lower surface sides of the mother insulating sheets 16 shown in FIG. 2, it is possible to prevent the conductive materials 18 from forming conductive lands in peripheral edge portions of the via holes 19 on upper surface sides of the mother insulating sheets 16. It is pointed out that even such conductive lands are within the scope of the present invention.

Then, the aforementioned mother insulating sheets 16 and 17 are stacked with each other and pressed. Thus, the mother laminate 14 is obtained. In this mother laminate 14, the via holes 19 provided in the respective ones of the plurality of mother insulating sheets 16 are aligned along the direction of thickness, whereby the conductive materials 18 filled up in the via holes 19 are connected in series with each other.

Then, grooves 20 are formed in the mother laminate 14 along cutting lines 15 (FIG. 2) with a dicing saw, for example, so that at least the via holes 19 are parted, for example. With such formation of the grooves 20, the via holes 19 are exposed on inner side surfaces of the grooves 20, while the conductive materials 18 which are filled up in the via holes 19 are parted so that portions enclosed by the grooves 20 for defining individual multilayer electronic components 10 are electrically independent of each other. Preferably, slits 21 and 22 are formed in bottom surfaces of the grooves 20 and lower surface portions of the mother laminate 14 opposite thereto respectively. Either the slits 21 or 22 may be omitted.

Figure 3:
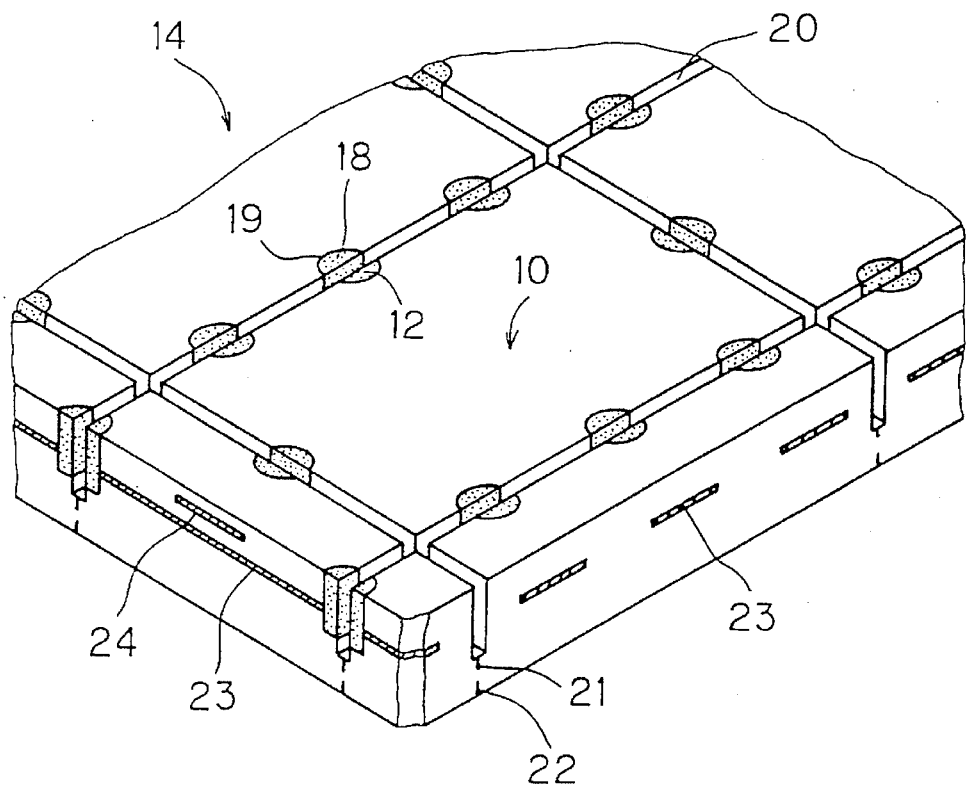
FIG. 3 is an enlarged perspective view illustrating grooves 20 which are formed in the mother laminate 14 shown in FIG. 2 for enabling measurement of characteristics.

FIG. 3 shows some conductor films 23 and 24 for serving as internal circuit elements. This figure also shows states of the conductor films 23 electrically connected with the conductive materials 18.

Then, the mother laminate 14 is fired to sinter ceramic materials forming the mother insulating sheets 16 and 17. Thereafter surfaces of the mother laminate 14 are provided with conductor films and/or resistor films, covered with an overcoat, and coated with solder resist. If necessary, the conductive materials 18 for forming external electrodes 3 and other conductor films are plated.

When the aforementioned steps are completed, the plurality of multilayer electronic components 10 included in the mother laminate 14 are so electrically independent of each other that it is possible to measure characteristics of each multilayer electronic component 10 while treating the conductive materials 18 provided in the respective portions of the via holes 19 parted by the grooves 20 as external electrodes.

After the characteristics are measured, other electronic components are mounted on those of the multilayer electronic components 10 which are determined as nondefective, to be composited with the same. The steps heretofore described can be efficiently carried out in the state of the mother laminate 14. The multilayer electronic components 10 may be shipped in this stage.

Then, the mother laminate 14 is completely cut along the cutting lines 15 (FIG. 2), i.e., the grooves 20 (FIG. 3), in order to obtain a plurality of multilayer electronic components 10 which are mechanically independent of each other. Such cutting is readily attained by dividing the mother laminate 14 like a chocolate bar along the grooves 20. The aforementioned slits 21 and 22 facilitate such division.

Thus, the multilayer electronic component 10 shown in FIG. 1 is obtained. As understood from the above description, the steps 13 result from the formation of the aforementioned grooves 20. When the laminate 11 is classified into upper and lower half portions through a boundary surface corresponding to the positions of the steps 13, the external electrodes 12 are exposed only on the upper half portion.

Then, the multilayer electronic component 10 is covered with a case at need. This case is adapted to cover other components which may be mounted on a lower surface of the multilayer electronic component 10 appearing in FIG. 1. This case is described later with reference to FIGS. 13 and 14.

While the present invention has been described with reference to the embodiment shown in FIGS. 1 to 3, various modifications are available within the scope of the present invention.

Figure 4:
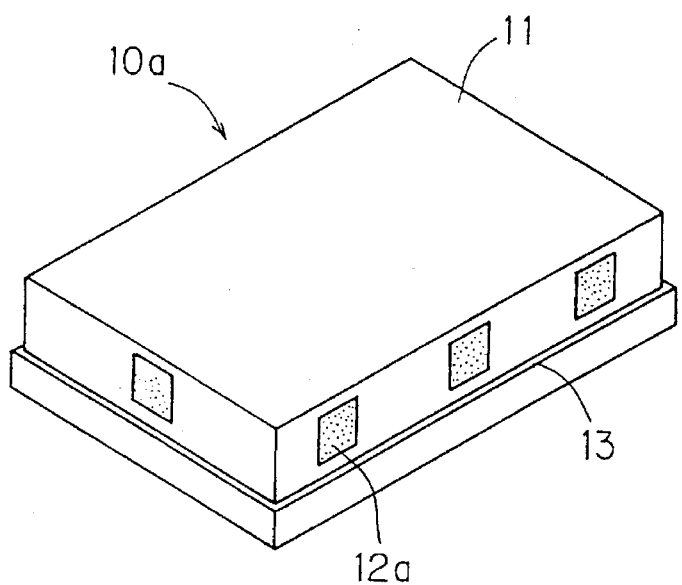
FIG. 4 is a perspective view showing the appearance of a multilayer electronic component 10a according to another embodiment of the present invention.

While the external electrodes 12 shown in FIG. 1 are formed to be exposed not only on the side surfaces of the laminate 11 but on the upper surface appearing in FIG. 1, such external electrodes 12a may be formed to be exposed only on side surfaces of a laminate 11 in a multilayer electronic component 10a shown in FIG. 4, for example. Referring to FIG. 4, elements corresponding to those shown in FIG. 1 are denoted by similar reference numerals, to omit redundant description.

According to the multilayer electronic component 10a shown in FIG. 4, it is possible to widely utilize not only a lower surface of the laminate 11 appearing in this figure but the upper surface as mounting surfaces for other components to be composited with this component 10a, with no interference by the external electrodes 12a. In order to obtain such a multilayer electronic component 10a, mother insulating sheets having no via holes 19 for forming external electrodes may be employed to form some of those located on an upper portion of the mother laminate 14 in a stage of manufacturing the mother laminate 14 shown in FIG. 2.

Figure 5:
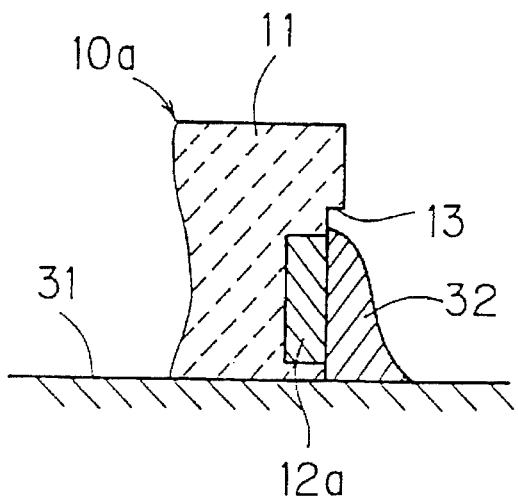
FIG. 5 is a sectional view illustrating the multilayer electronic component 10a shown in FIG. 4 which is mounted on a circuit board 31.

When the aforementioned multilayer electronic component 10a is placed on a circuit board 31 as shown in FIG. 5, a gap is defined between the circuit board 31 and each external electrode 12a. In order to mount the multilayer electronic component 10a on the circuit board 31 in such a state, a solder fillet 32 is advantageously employed in order to electrically connect the external electrode 12a with a conductive land (not shown) on the circuit board 31.

Figure 6:
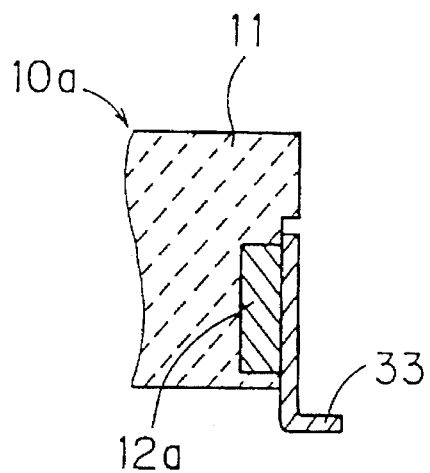
FIG. 6 is a sectional view illustrating a terminal member 33 which is mounted on the multilayer electronic component 10a shown in FIG. 4.

Alternatively, a terminal member 33 of a metal may be mounted on each external electrode 12a of such a multilayer electronic component 10a, as shown in FIG. 6.

The external electrodes 12 of the mode shown in FIG. 1 may be mixed with the external electrodes 12a of the mode shown in FIG. 4 in a single multilayer electronic component.

While the via holes 19 for providing the external electrodes 12 have circular sections in the embodiment shown in FIGS. 1 to 3, such sections may be changed to other forms such as rectangular shapes. Further, a single external electrode may be provided by a plurality of via holes which are partially overlapped with each other in section, or by a via hole long from side to side, in order to expose such external electrodes in wider areas.

The grooves 20 and the slits 21 and 22 may be formed after firing of the mother laminate 14. If no efficiency in formation of the conductor films/resistor films on the fired laminate 14 or plating or characteristic measurement is taken into consideration, the mother laminate 14 may be cut along the cutting lines 15 before firing, so that the multilayer electronic components 10 are fired in mechanically separated states. Further, the mother laminate 14 may be cut along the cutting lines 15 immediately after firing, through no stage of forming the grooves 20.

The conductive materials 18 to be filled up in the via holes 19 may not be applied simultaneously with printing of the conductor films, but the via holes 19 may be filled up with metal paste in another step. In this case, it is also possible to simultaneously fill up the conductive materials 18 in the plurality of via holes 19 being aligned in series with each other in the plurality of mother insulating sheets 16 which are stacked with each other.

The insulating sheets are not restricted to ceramic sheets, but may be prepared from other materials.

Figure 7:
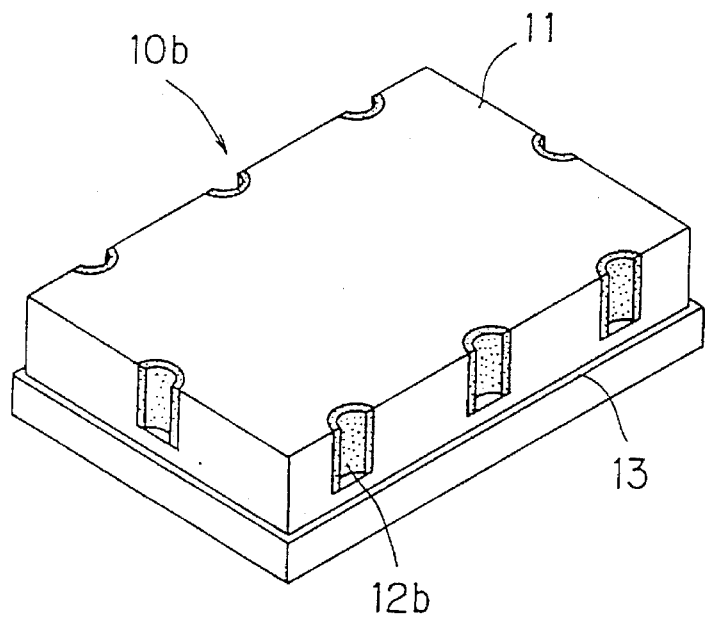
FIG. 7 is a perspective view showing the appearance of a multilayer electronic component 10b according to still another embodiment of the present invention.

As shown in FIG. 7, further, external electrodes 12b of a multilayer electronic component 10b may be provided by conductive materials which are layered on inner peripheral surfaces of the via holes 19 (FIGS. 2 and 3). In this case, the external electrodes 12b define cavities on outer surfaces thereof.

The present invention is not restricted to a multilayer electronic component having a plurality of external electrodes all of which are formed on the basis of via holes, but is also applicable to a multilayer electronic component including some external electrodes which are formed by another method.

Figure 8:
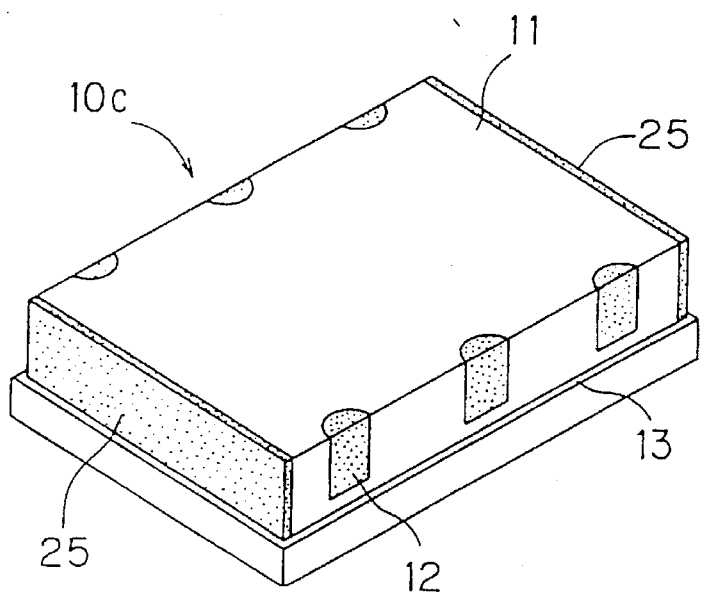
FIG. 8 is a perspective view showing the appearance of a multilayer electronic component 10c according to a further embodiment of the present invention.

As shown in FIG. 8, for example, a multilayer electronic component 10c may have some external electrodes 12 which are formed on the basis of via holes and other external electrodes, such as shielding electrodes 25, for example, which are formed by another method. In formation of the grooves 20 as shown in FIG. 3, for example, grooves 20 having inner side surfaces to be provided with such shielding electrodes 25 are first prepared so that metal paste is filled up in these grooves 20 by injection. Finally the grooves 20 are cut again to part conductive materials provided by the metal paste, thereby forming the shielding electrodes 25. These shielding electrodes 25 are often electrically connected with ground-side internal circuit elements (not shown) of the laminate 11.

The aforementioned shielding electrodes 25 may alternatively be formed on the basis of via holes, as a matter of course. In this case, the via holes are formed by slots longitudinally extending along the shielding electrodes 25. Such shielding electrodes 25 may be formed after the individual multilayer electronic components 10c are obtained.

Figure 9:
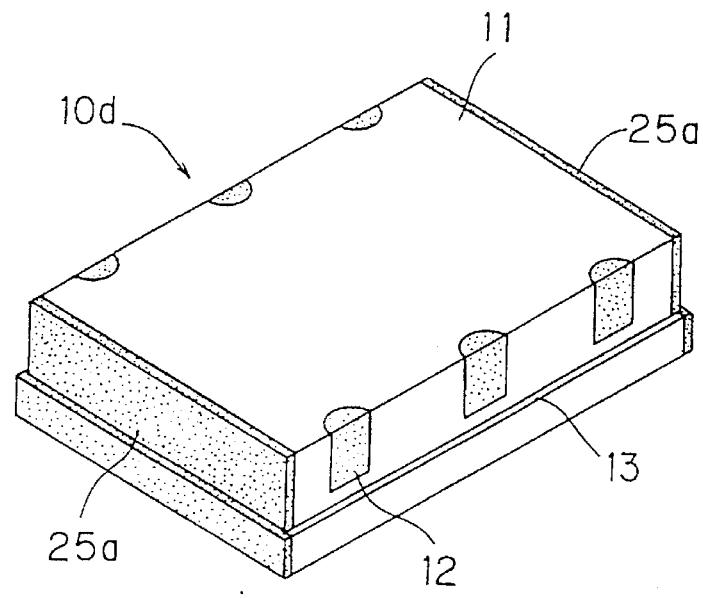
FIG. 9 is a perspective view showing the appearance of a multilayer electronic component 10d according to a further embodiment of the present invention.

As shown in FIG. 9, shielding electrodes 25a may be formed to extend downwardly beyond steps 13, in order to improve shielding performance. Such shielding electrodes 25a can be formed by any of the following methods, for example:

(a) A method of forming the overall shielding electrodes 25a on the basis of via holes.

(b) A method of forming only lower half portions of the shielding electrodes 25a beyond the steps 13 on the basis of via holes while forming upper half portions by filling up the grooves 20 shown in FIG. 3 with metal paste.

(c) A method of forming upper half portions of the shielding electrodes 25a by filling up the grooves 20 with metal paste, obtaining individual multilayer electronic components 10a, and thereafter forming lower half portions.

(d) A method of forming upper half portions of the shielding electrodes 25a on the basis of via holes, obtaining individual multilayer electronic components 10d, and thereafter forming lower half portions.

(e) A method of forming the overall shielding electrodes 25a after obtaining individual multilayer electronic components 10d.

When the method (a) or (b) is employed among the aforementioned methods of forming the shielding electrodes 25a, the plurality of multilayer electronic components 10d are electrically connected with each other through the shielding electrodes 25a and not yet completely electrically independent of each other in a stage provided with the grooves 20 shown in FIG. 3. However, no hindrance is caused in measurement of characteristics of the individual multilayer electronic components 10d in the aforementioned state of the mother laminate 14 when the shielding electrodes 25a are adapted to serve as a common earthed electrode in such characteristics measurement.

In the multilayer electronic component 10d shown in FIG. 9, an area which is provided on the lower surface of the laminate 11 for mounting other components may be narrowed by the shielding electrodes 25a. In order to avoid such inconvenience, shielding electrodes 25b may be formed not to reach a lower surface of a laminate 11 provided in a multilayer electronic component 10e, as shown in FIG. 10.

Figure 10:
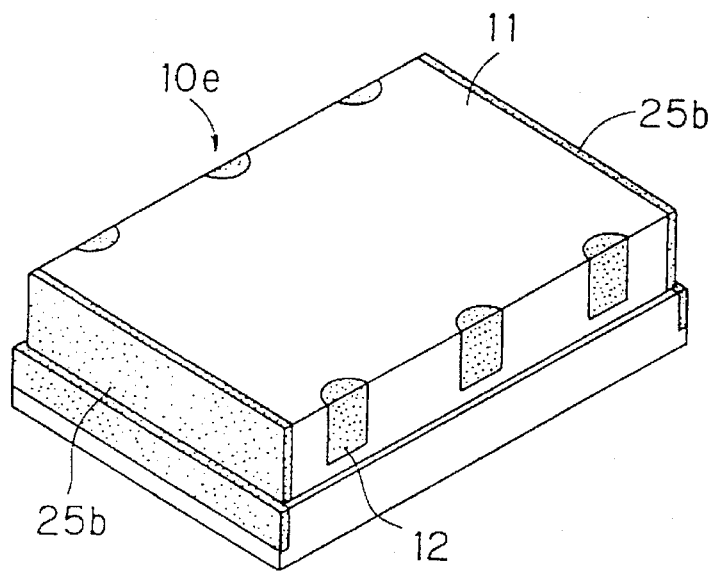
FIG. 10 is a perspective view showing the appearance of a multilayer electronic component 10e according to a further embodiment of the present invention.

In relation to each mode of formation of the shielding electrodes 25, 25a and 25b shown in FIGS. 8 to 10, the upper half portion(s) of the shielding electrode(s) may be formed on only one or three side surfaces of the laminate 11. The lower half portions of the shielding electrodes may be formed on three or four side surfaces of the laminate 11. Although only the shielding electrodes 25 corresponding to upper half portions are provided in FIG. 8, only shielding electrodes corresponding to lower half portions may alternatively be provided.

Figure 11:
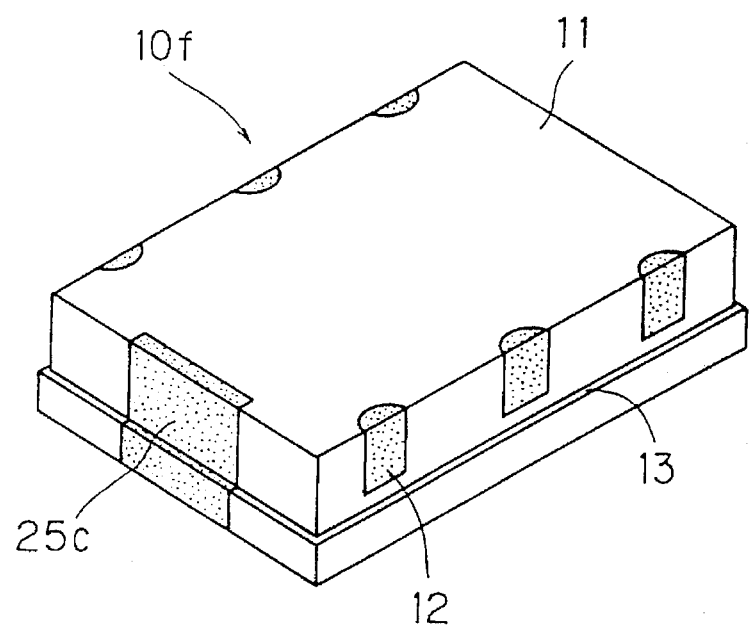
FIG. 11 is a perspective view showing the appearance of a multilayer electronic component 10f according to a further embodiment of the present invention.

As shown in FIG. 11, further, a shielding electrode 25c may be provided on a multilayer electronic component 10f to cover only a part of one side surface of a laminate 11 along the cross direction.

Figure 12:
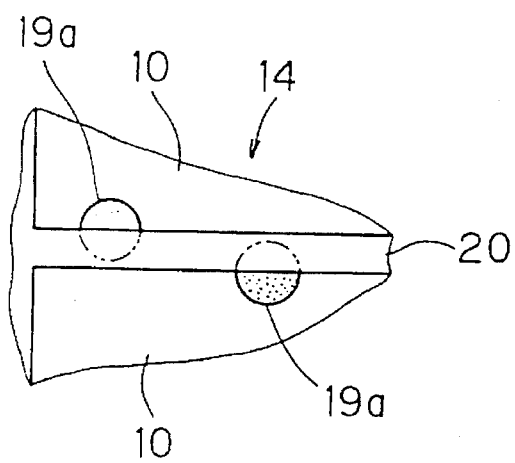
FIG. 12 is a plan view showing a part of a mother laminate 14 for illustrating a further embodiment of the present invention.

In each of the aforementioned embodiments, each via hole 19 is so parted as to define external electrodes 12 for respective ones of two multilayer electronic components 10. When the width of each groove 20 shown in FIG. 3 occupies a considerable part along the diameter of each via hole 19, however, a single via hole 19a may be adapted to define a single external electrode, as shown in FIG. 12. FIG. 12 shows parts of the via holes 19a before formation of the groove 20 with two-dot chain lines.

Figure 13:
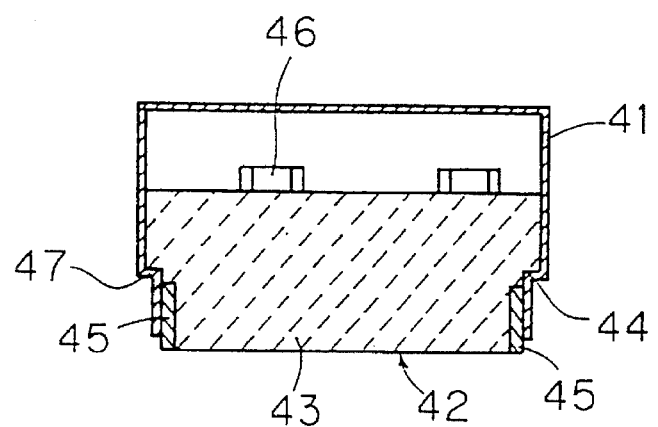
FIG. 13 is a sectional view showing a cased multilayer electronic component 42 according to a further embodiment of the present invention.

FIG. 13 is a sectional view showing a multilayer electronic component 42 which is covered with a case 41.

A laminate 43 provided in the multilayer electronic component 42 has steps 44, and external electrodes 45 are formed under these steps 44. Some electronic components 46 are mounted on an upper surface of the laminate 43 appearing in FIG. 13 for compositing this multilayer electronic component 42. The case 41 is made of a metal. This case 41 is provided with steps 47 in conformity with side surfaces of the laminate 43, and soldered to the external electrodes 45, for example.

Figure 14:
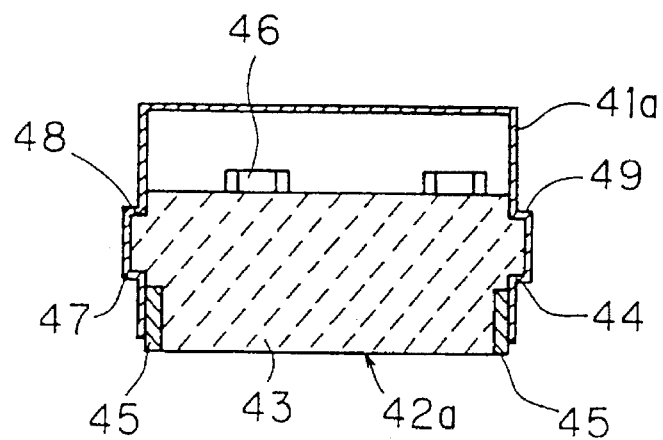
FIG. 14 is a sectional view showing a cased multilayer electronic component 42a according to a further embodiment of the present invention.
Figure 15:
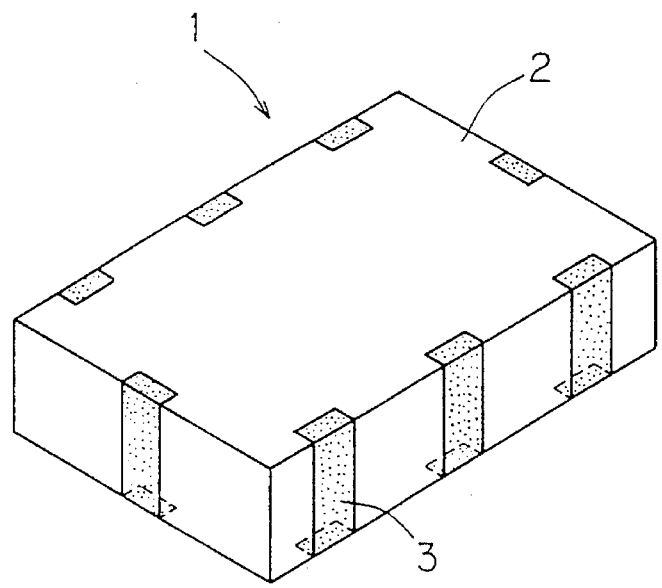
FIG. 15 is a perspective view showing the appearance of a conventional multilayer electronic component 1.
Figure 16:
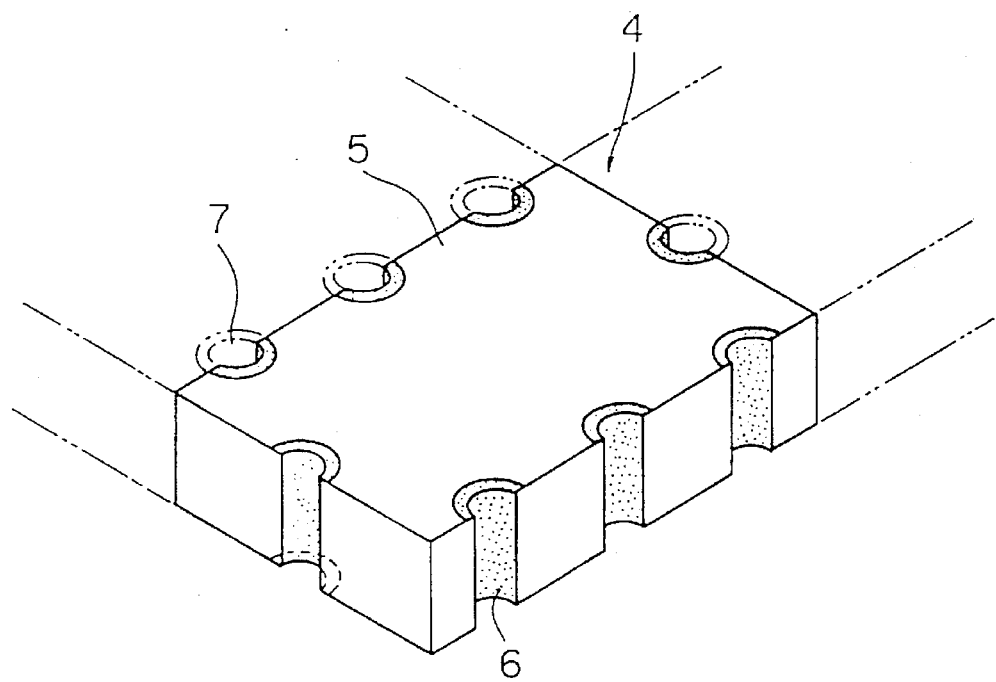
FIG. 16 is a perspective view showing the appearance of another type of conventional multilayer electronic component 4.

FIG. 14 shows another multilayer electronic component 42a which is covered with a case 41a. Referring to FIG. 14, elements corresponding to those shown in FIG. 13 are denoted by similar reference numerals, to omit redundant description.

Referring to FIG. 14, a laminate 43 which is provided in the multilayer electronic component 42a is formed not only with steps 44 but with further steps 48. On the other hand, the case 41a is provided with steps 49 which are engaged with the steps 48. The steps 49 of the case 41a are so engaged with the steps 48 of the laminate 43 that the case 41a is further strongly mounted on the laminate 43. Even if force is applied to the upper surface of the case 41a to downwardly press the same, in particular, the case 41a is not disengaged from the external electrodes 45. Such force of downwardly pressing the case 41a is often applied from a vacuum suction chuck (not shown) which sucks the multilayer electronic component 42a toward the upper surface of the case 41 for holding the same. The steps 48 can be formed on the laminate 43 by a method similar to that for the steps 44. Namely, grooves similar to the grooves 20 may be formed from below in positions corresponding to the grooves 20 in the stage of the mother laminate 14 shown in FIG. 3.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a plurality of multilayer electronic components, comprising the steps of:

preparing a mother laminate, adapted to be cut along prescribed cutting lines for obtaining said plurality of multilayer electronic components;

said mother laminate being formed by the steps of stacking a plurality of mother insulating sheets with internal circuit elements interposed between said mother insulating sheets;

said internal circuit elements providing respective said multilayer electronic components by said internal circuit elements being distributed in respective regions of said mother laminate to be parted by said prescribed cutting lines; and forming via holes in said mother laminate, and providing said holes with conductive materials electrically connected with said internal circuit elements, in positions in said mother laminate so as to be exposed at cut surfaces to be formed by cutting along said prescribed cutting lines; and cutting partially but not completely through said mother laminate along said prescribed cutting lines so as to expose said conductive materials at said cut surfaces and thereby form said plurality of multilayer electronic components, which are electrically independent of each other while still being mechanically integrated with each other.

2. A method of manufacturing a multilayer electronic component in accordance with claim 1, wherein said step of cutting said mother laminate comprises a step of forming grooves in said mother laminate to expose said via holes on said cut surfaces.

3. A method of manufacturing a multilayer electronic component in accordance with claim 1, wherein said mother insulating sheets are ceramic green sheets, said method further comprising a step of firing said mother laminate following said cutting step.

4. A method of manufacturing a multilayer electronic component in accordance with claim 2, further comprising the step of forming slits adjacent to said grooves in said mother laminate in positions thereof not cut through in said cutting step.

5. A method of manufacturing a multilayer electronic component in accordance with claim 2, further comprising the step of dividing said mother laminate, provided with said grooves, at positions of said grooves.

6. A method of manufacturing a multilayer electronic component in accordance with claim 5, further comprising the step of forming slits adjacent to said grooves in said mother laminate in positions thereof not cut through in said cutting step.

7. A method of manufacturing a multilayer electronic component in accordance with claim 6, wherein said mother laminate is divided at said slits.

* * * * *